(12) United States Patent
Chen et al.

(10) Patent No.: US 11,381,222 B2
(45) Date of Patent: Jul. 5, 2022

(54) APPARATUS FOR PERFORMING BASELINE WANDER CORRECTION WITH AID OF DIFFERENTIAL WANDER CURRENT SENSING

(71) Applicants: FARADAY TECHNOLOGY CORPORATION, Suzhou (CN); Faraday Technology Corp., Hsin-Chu (TW)

(72) Inventors: Ling Chen, Suzhou (CN); Andrew Chao, Beaverton, OR (US); Xiao-Dong Fei, Suzhou (CN)

(73) Assignees: FARADAY TECHNOLOGY CORPORATION, Suzhou (CN); Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 17/178,194

(22) Filed: Feb. 17, 2021

(65) Prior Publication Data

US 2021/0313970 A1    Oct. 7, 2021

(30) Foreign Application Priority Data

Apr. 1, 2020    (CN) .......................... 202010249124.9

(51) Int. Cl.
*H03K 3/012* (2006.01)
*H03K 5/01* (2006.01)
(Continued)

(52) U.S. Cl.
CPC ............ *H03K 3/012* (2013.01); *H03K 3/037* (2013.01); *H03K 5/01* (2013.01); *H03K 5/1252* (2013.01);
(Continued)

(58) Field of Classification Search
CPC .......... H04B 1/16; H04B 1/1661–1684; H03K 5/1252; H03K 5/01; H03K 3/012; H03K 3/037

See application file for complete search history.

(56) References Cited

U.S. PATENT DOCUMENTS

| 7,961,817 B2 | 6/2011 | Dong |
| 10,523,470 B1 * | 12/2019 | Hu ...................... H03F 3/45192 |
| 2017/0244581 A1 * | 8/2017 | Islam .................. H04L 25/0296 |

FOREIGN PATENT DOCUMENTS

| TW | 201223175 A1 | 6/2012 |
| TW | 202008759 A | 2/2020 |

* cited by examiner

*Primary Examiner* — Patrick C Chen
(74) *Attorney, Agent, or Firm* — Winston Hsu

(57) ABSTRACT

An apparatus for performing baseline wander correction (BLWC) with the aid of differential wander current sensing includes filters and a correction circuit. The filters are positioned in a front-end circuit of a receiver and coupled to a set of input terminals of the receiver, and filter a set of input signals on the set of input terminals to generate a set of differential signals on a set of secondary terminals, for further usage by the receiver. The correction circuit is positioned in the frontend circuit and electrically connected to the set of input terminals and the set of secondary terminals, and performs BLWC on the set of differential signals according to the set of input signals. In the correction circuit, amplifiers and resistors form a differential wander current sensor to sense differential wander current, and a set of current mirrors generate corresponding baseline wander compensation current to perform BLWC.

17 Claims, 11 Drawing Sheets

(51) Int. Cl.
*H03K 5/1252* (2006.01)
*H03K 5/00* (2006.01)
*H04B 1/16* (2006.01)
*H03K 3/037* (2006.01)
*H03K 19/20* (2006.01)

(52) U.S. Cl.
CPC ............... *H04B 1/16* (2013.01); *H03K 19/20* (2013.01); *H03K 2005/00019* (2013.01)

APPARATUS FOR PERFORMING BASELINE WANDER CORRECTION WITH AID OF DIFFERENTIAL WANDER CURRENT SENSING

BACKGROUND OF THE INVENTION

1. Field of the Invention

The present invention is related to signal processing, and more particularly, to an apparatus for performing baseline wander correction with the aid of differential wander current sensing.

2. Description of the Prior Art

Serializer/Deserializer (SerDes) architecture can be applied to data transmission performed through limited number of input/output terminals, such as high speed data transmission between multiple circuits or devices. In a situation where the SerDes architecture is not properly designed, there may be some problems. For example, a SerDes receiver front-end circuit may have some filters for filtering unwanted low frequency signals. When an input signal of the SerDes receiver front-end circuit carries a series of data such as consecutive logic values 0 or consecutive logic values 1, these filters may introduce a baseline wander effect. Some related arts have proposed various solutions for reducing this effect, but side effects such as complexity of circuit architecture, low efficiency, low speed, additional data processing, and so on may be introduced. Thus, there is a need for a novel architecture to improve overall performance without introducing any side effect or in a way that is less likely to introduce side effects.

SUMMARY OF THE INVENTION

An objective of the present invention is to provide an apparatus for performing baseline wander correction (BLWC) with the aid of differential wander current sensing, to solve the aforementioned problems.

Another objective of the present invention is to provide an apparatus for performing BLWC with the aid of differential wander current sensing to improve overall performance without introducing any side effect or in a way that is less likely to introduce side effects.

At least one embodiment of the present invention provides an apparatus for performing BLWC with the aid of differential wander current sensing. The apparatus comprises: multiple filters, positioned in a front-end circuit of a receiver and coupled to a set of input terminals of the receiver; and a correction circuit, positioned in the frontend circuit and electrically connected to both the set of input terminals and the set of secondary terminals. The multiple filters may be arranged to filter a set of input signals on the set of input terminals to generate a set of differential signals on a set of secondary terminals, for further usage by the receiver, and the correction circuit may be arranged to perform the BLWC on the set of differential signals according to the set of input signals. For example, a set of amplifiers and a set of resistors within the correction circuit form a differential wander current sensor which can sense at least one differential wander current on a differential wander current sensing path coupled between the set of input terminals, and a set of current mirrors within the correction circuit generates at least one corresponding baseline wander compensation current according to the at least one differential wander current on the differential wander current sensing path, to perform the BLWC.

The present invention has several advantages. The apparatus of the present invention can properly eliminate baseline wandering and provide a stable common mode voltage, and the apparatus has good circuit characteristics. More particularly, the apparatus of the present invention can provide a better power supply rejection ratio (PSRR), can minimize compensation time delay, can improve positive/negative (P/N) skew, and can calibrate P/N offset introduced by one or more factors such as device mismatch, bad input differential signals, etc. The apparatus can also provide good isolation between respective common mode voltages of input and output sides of alternating current (AC) coupled capacitors (e.g. the common mode voltage before passing through the AC coupled capacitors and the common mode voltage after passing through the AC coupled capacitors along the signal paths of the AC coupled capacitors). In comparison with the related art, the apparatus of the present invention has less common mode voltage stabilization time, and is more suitable for the application of fast switching signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
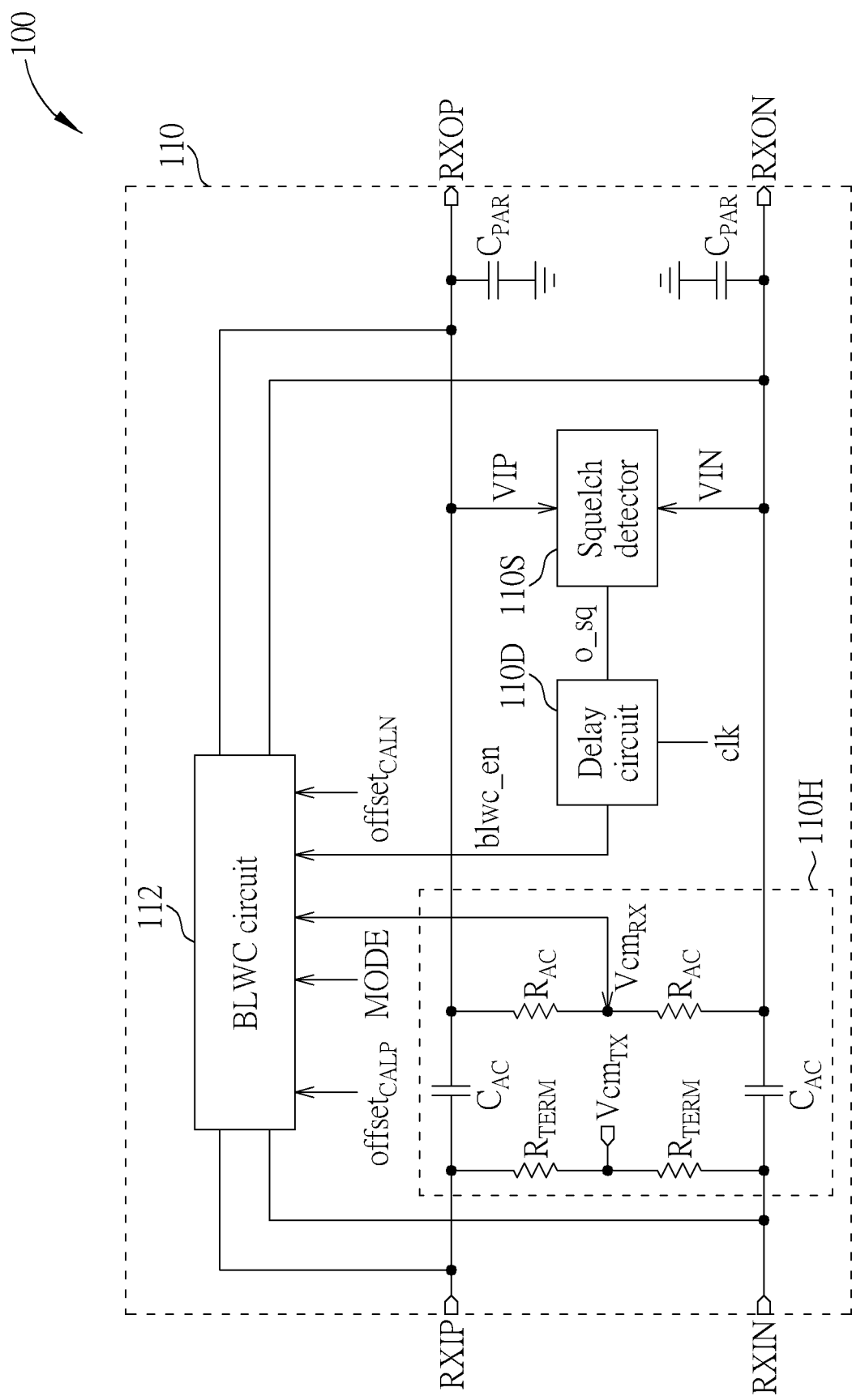
FIG. 1 is a diagram illustrating an apparatus for performing baseline wander correction (BLWC) with the aid of differential wander current sensing according to an embodiment of the present invention.

FIG. 1 is a diagram illustrating an apparatus for performing baseline wander correction (BLWC) with the aid of differential wander current sensing according to an embodiment of the present invention, where the apparatus is applicable to a front-end circuit of a receiver 100. Examples of the receiver 100 may include, but are not limited to: a receiver within a Serializer/Deserializer (SerDes) architecture, which is referred to herein as a SerDes receiver for brevity. The apparatus may comprise a high pass filter (HPF) and BLWC module 110, and the HPF and BLWC module 110 may comprise a filtering and common mode control circuit 110H, a detection module and a correction circuit such as a BLWC circuit 112, where the detection module may comprise a squelch detector 110S and a delay circuit 110D, but the present invention is not limited thereto. In some embodiments, the detection module may vary. As shown in FIG. 1, the HPF and BLWC module 110 may comprise multiple filters, e.g. multiple passive components such as multiple capacitors $\{C_{AC}\}$ and multiple resistors $\{\{R_{TERM}\}, \{R_{AC}\}\}$ within the filtering and common mode control circuit 110H. In addition, the HPF and BLWC module 110 (for example, the multiple filters, the BLWC circuit 112, etc.) may be positioned in the front-end circuit, but the present invention is not limited thereto. For better comprehension, in some embodiments, a related parameter of a component may be illustrated as the name of the component in italics, and/or a signal on a terminal may be illustrated as the name of the terminal in italics.

According to this embodiment, the multiple filters such as the capacitors $\{C_{AC}\}$ and the resistors $\{\{R_{TERM}\}, \{R_{AC}\}\}$ may be coupled to a set of input terminals {RXIP, RXIN} of the receiver 100, and may be arranged to filter a set of input signals (e.g. input differential signals) on the set of input terminals {RXIP, RXIN} to generate a set of differential signals on a set of secondary terminals {RXOP, RXON}, for further usage by the receiver 100. In the multiple filters, a set of capacitors $\{C_{AC}\}$ may have a same capacitance $C_{AC}$, a set of resistors $\{R_{TERM}\}$ may have a same resistance $R_{TERM}$, and a set of resistors $\{R_{AC}\}$ may have a same resistance $R_{AC}$, where the above filters may be coupled to at least one communications channel via the set of input terminals {RXIP, RXIN}. In addition, the set of resistors $\{R_{TERM}\}$ may be regarded as a input load resistor of the receiver 100, the set of capacitors $\{C_{AC}\}$ may be regarded as alternating current (AC) coupled capacitors, and the capacitors $\{C_{AC}\}$ and the resistors $\{R_{AC}\}$ may form a high pass filter network for blocking direct current (DC) components. A symbol "$C_{PAR}$" may represent parasitic capacitors, which may comprise wiring capacitors, and/or input capacitor(s) of back-end circuit(s). Furthermore, the correction circuit such as the BLWC circuit 112 may be electrically connected to the set of input terminals {RXIP, RXIN} and the set of secondary terminals {RXOP, RXON}, respectively, and may be arranged to perform the BLWC on the set of differential signals according to the set of input signals.

The detection module (e.g. the squelch detector 110S and the delay circuit 110D) mentioned above may be coupled to the set of secondary terminals {RXOP, RXON} and the correction circuit such as the BLWC circuit 112, and may be arranged to perform detection according to the set of differential signals or derivative signals thereof, to generate a BLWC enable signal blwc_en, for selectively enabling or disabling the BLWC circuit 112. More particularly, the squelch detector 110S may perform squelch detection according to the set of differential signals or derivative signals thereof, to generate a squelch detector output signal o_sq, and the delay circuit 110D may perform a delay operation according to the squelch detector output signal o_sq, to generate the BLWC enable signal blwc_en. For example, the squelch detector 110S may be arranged to detect whether an input signal exists. If the input signal exists, the squelch detector 110S outputs the squelch detector output signal o_sq as a valid output for the delay circuit 110D to generate the BLWC enable signal blwc_en. As there is a period of delay time $T_{Delay}$ between the time point of the input signal occurring and the time point of the BLWC enable signal blwc_en becoming the valid output, and no baseline wander compensation current is activated during this period of time under a condition where the BLWC circuit 112 is not enabled, a common mode voltage can be stabilized quickly.

Based on the architecture shown in FIG. 1, the apparatus can properly perform the BLWC, and can also effectively isolate common mode voltages in the front/back of the AC coupling capacitors {CAC}, such as a common mode voltage $Vcm_{TX}$ of the set of input signals on the set of input terminals {RXIP, RXIN} and a common mode voltage $Vcm_{RX}$ of the set of differential signals on the set of secondary terminals {RXIP, RXIN}. More particularly, the apparatus can quickly stabilize the common mode voltage $Vcm_{RX}$ to control the common mode voltage $Vcm_{RX}$ to be equal to a reference voltage Vref, but the present invention is not limited thereto.

In addition, the BLWC circuit 112 may operate according to related signals such as a mode signal MODE, offset calibration signals offset$_{CALP}$ and offset$_{CALN}$, etc. and related parameters such as parameters a, (3, etc. More particularly, the BLWC circuit 112 may be switched between multiple modes according to the mode signal MODE and perform offset calibration according to the offset calibration signals offset$_{CALP}$ and offset$_{CALN}$, but the present invention is not limited thereto. In some embodiments, the number and types of multiple functions, related signals for controlling some functions, and/or related parameters for setting some functions of the BLWC circuit 112 may vary.

Figure 2:
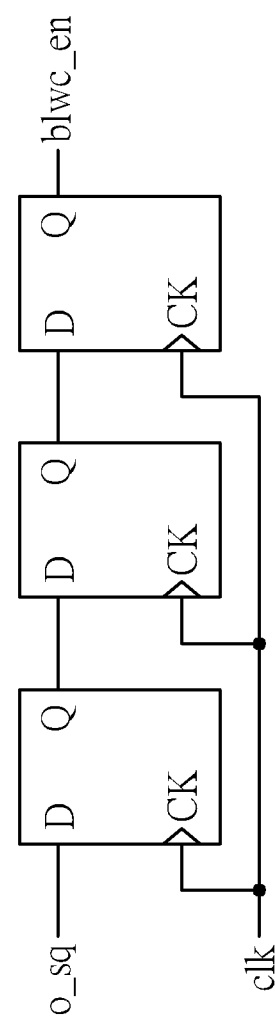
FIG. 2 illustrates an example of a delay circuit shown in FIG. 1.

FIG. 2 illustrates an example of the delay circuit 110D shown in FIG. 1. The delay circuit 110D may comprise multiple flip-flops connected in series (such as multiple D flip-flops (DFFs) connected in series stage by stage via terminals D and Q thereof), and may be implemented by utilizing a slower clock signal clk (e.g. speed thereof is typically less than speed of a clock signal CLK arranged for data sampling) to sample the squelch detector output signal o_sq in the architecture of DFFs connected in series, where the clock signal clk is input to a clock terminal such as a terminal CK of each DFF of these DFFs.

Figure 3:
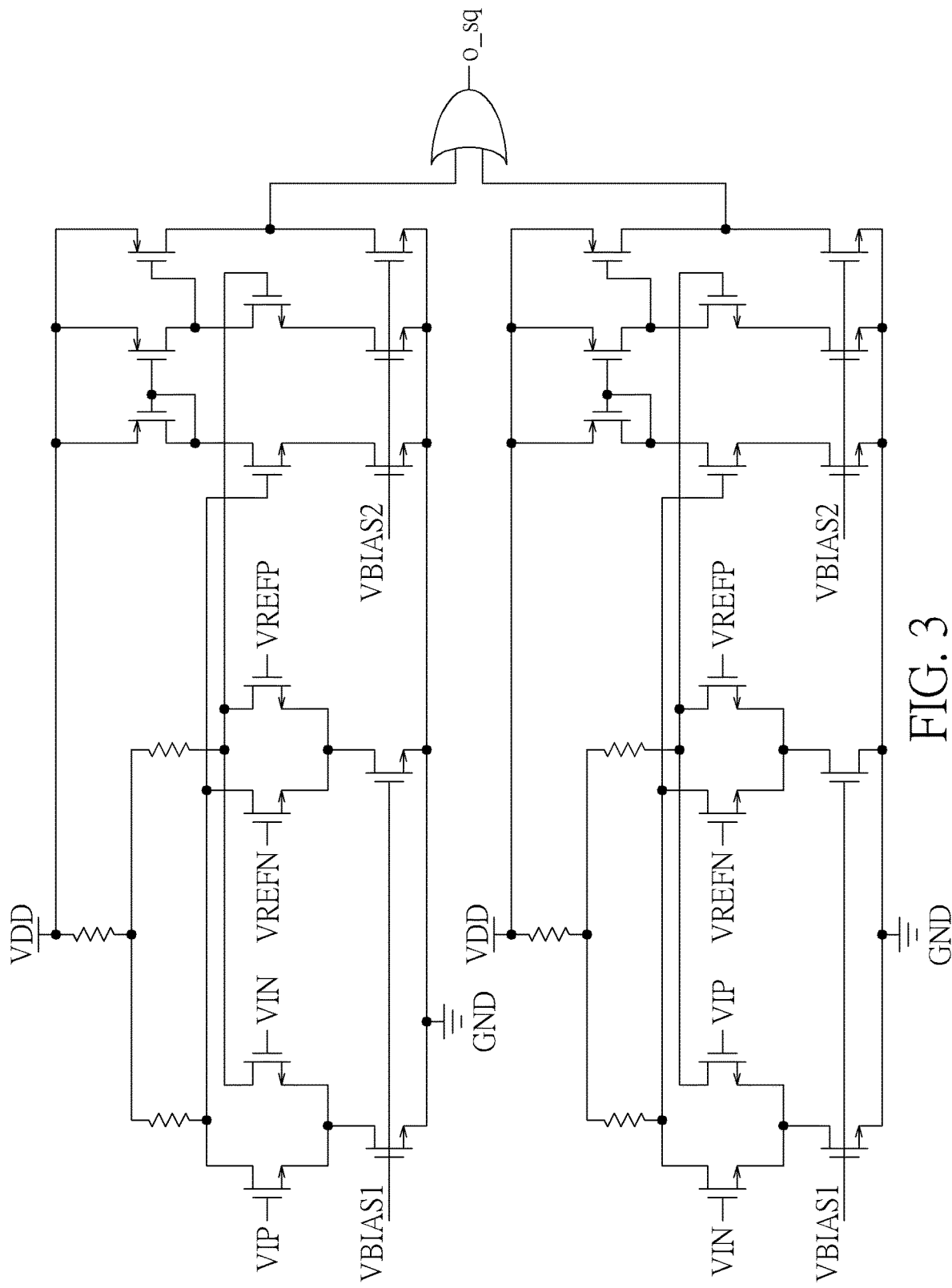
FIG. 3 illustrates an example of a squelch detector shown in FIG. 1.

FIG. 3 illustrates an example of the squelch detector 110S shown in FIG. 1. The squelch detector 110S may operate according to bias voltages VBIAS1 and VBIAS2, reference voltages VREFP and VREFN, and voltages VIP and VIN shown in FIG. 1. For example, VDD>VBIAS2>GND and VDD>VBIAS1>GND, where the symbols "VDD" and "GND" represent a power supply voltage and a ground voltage of the receiver 100, respectively, but the present invention is not limited thereto. In the circuit architecture shown in FIG. 3, except for an OR gate positioned on the rightmost side, an upper portion circuit and a lower portion circuit may be regarded as a first sub-circuit and a second sub-circuit of the squelch detector 110S, respectively, and may be almost identical to each other, where the difference is that the voltages VIP and VIN respectively received by respective input voltage terminals of the first sub-circuit and the second sub-circuit are exchanged. Based on this circuit architecture, the squelch detector 110S may perform the following detection to generate corresponding outputs:

if |VIP−VIN|≥(VREFP−VREFN),o_sq=1;

otherwise, o_sq=0;

where o_sq=1 means the squelch detector output signal o_sq carries a logic value 1 (e.g. has a high voltage level), and o_sq=0 means the squelch detector output signal o_sq carries a logic value 0 (e.g. has a low voltage level), but the present invention is not limited thereto. In addition, the reference voltage VREFP may be greater than the reference voltage VREFN. The first sub-circuit may check whether "(VIP−VIN)≥(VREFP−VREFN)" is true to generate a corresponding logic value as an upper output of the OR gate, and the second sub-circuit may check whether "(VIN−VIP)≥(VREFP−VREFN)" is true to generate a corresponding logic value as a lower output of the OR gate, but the present invention is not limited thereto.

According to this embodiment, the squelch detector 110S may be arranged to detect input signals. If an amplitude of an input signal reaches (e.g. is greater than or equal to) a predetermined amplitude threshold such as (VREFP−VREFN) and time (or width) of continuous appearance of the waveform of the input signal reaches (e.g. is greater than or equal to) a predetermined time threshold, the squelch detector 110S outputs the squelch detector output signal o_sq as a valid output such as the high voltage level; otherwise, the squelch detector 110S outputs the squelch detector output signal o_sq as an invalid output such as the low voltage level, but the present invention is not limited thereto.

Figure 4:
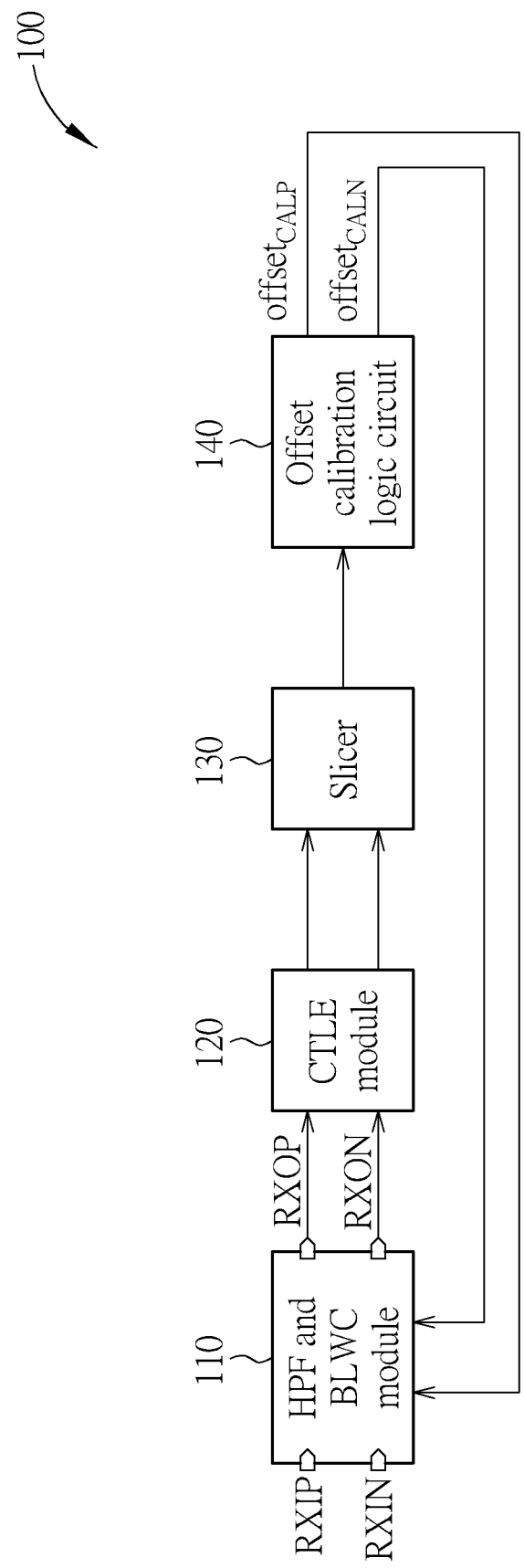
FIG. 4 illustrates an offset calibration architecture related to the BLWC circuit shown in FIG. 1 according to an embodiment of the present invention.

FIG. 4 illustrates an offset calibration architecture related to the BLWC circuit 112 shown in FIG. 1 according to an embodiment of the present invention. The apparatus may further comprise a continuous time linear equalizer (CTLE) module 120, a slicer 130 and an offset calibration logic circuit 140, and these components may be positioned in the front-end circuit, but the present invention is not limited thereto. For example, a portion of components such as the CTLE module 120 may be an optional component. The CTLE module 120 may perform continuous time linear equalization. The slicer 130 may be coupled to the set of secondary terminals {RXOP, RXON} through the CTLE module 120, and may generate a digital signal according to the set of differential signals or derivative signals thereof. The offset calibration logic circuit 140 may be electrically connected to the slicer 130 and the correction circuit such as the BLWC circuit 112, and may generate the offset calibration signals offset$_{CALP}$ and offset$_{CALN}$ according to the digital signal, to control the BLWC circuit 112 to perform offset calibration.

Figure 5:
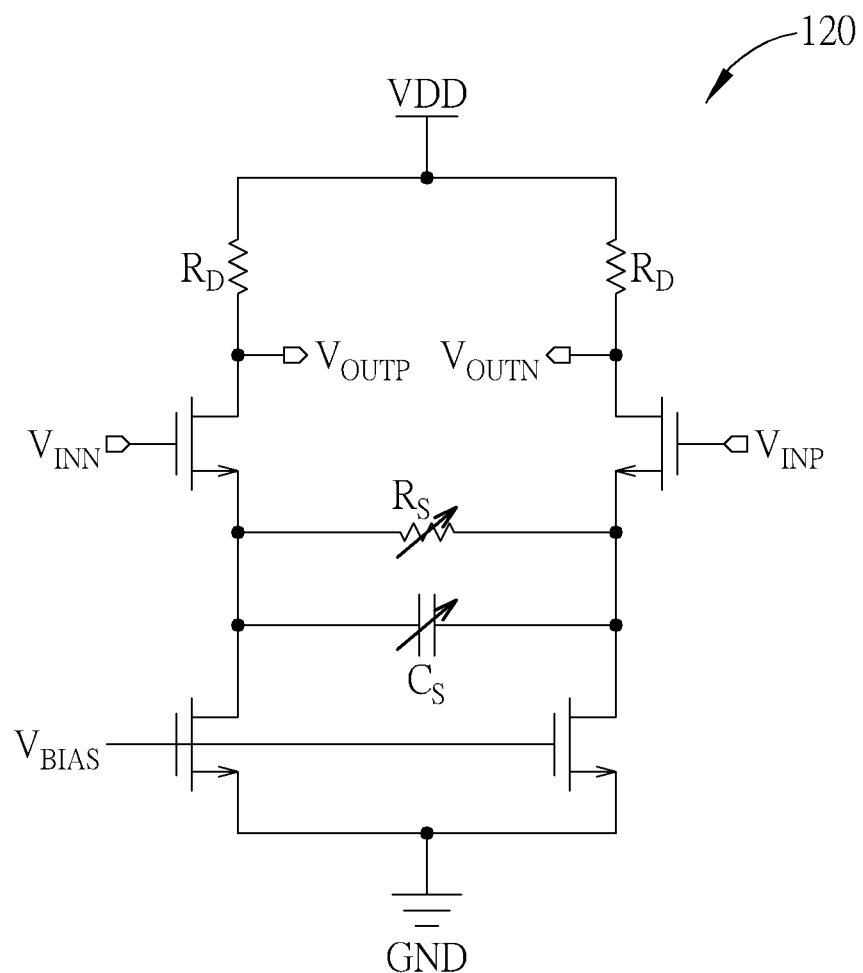
FIG. 5 illustrates an example of a continuous time linear equalizer (CTLE) module shown in FIG. 4.
Figure 6:
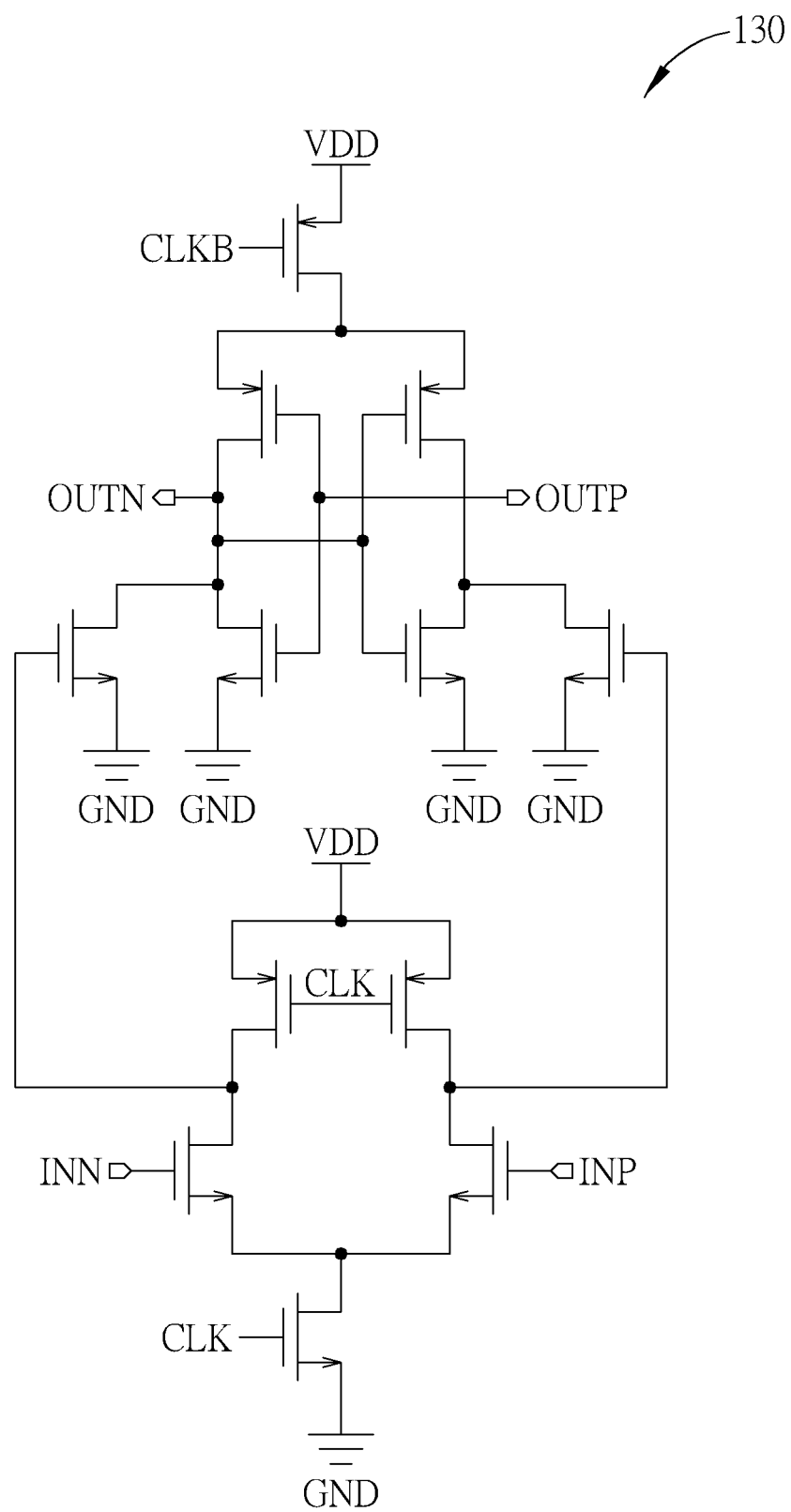
FIG. 6 illustrates an example of a slicer shown in FIG. 4.

FIG. 5 and FIG. 6 illustrate examples of the CTLE module 120 and the slicer 130 shown in FIG. 4, respectively. Voltages $V_{INP}$ and $V_{INN}$ on input terminals of the CTLE module 120 may represent the set of differential signals on the set of secondary terminals {RXOP, RXON}, respectively, and voltages $V_{OUTP}$ and $V_{OUTN}$ on output terminals of the CTLE module 120 may represent respective signals of an upper input terminal and a lower input terminal of the slicer 130 shown in FIG. 4 (such as signals INP and INN of the slicer 130 shown in FIG. 5), respectively, but the present invention is not limited thereto. For example, when implementation of the CTLE 120 is not required, the signals INP and INN of the slicer 130 shown in FIG. 5 may represent the set of differential signals on the set of secondary terminals {RXOP, RXON}, respectively.

As shown in FIG. 5, the CTLE module 120 may comprise multiple transistors, a set of resistors {$R_D$} (which may have a same resistance $R_D$), another resistor $R_S$ and a capacitor $C_S$, and may operate according to a bias voltage $V_{BIAS}$ and the voltages $V_{IN}$p and $V_{INN}$, where the resistor $R_S$ and the capacitor $C_S$ may be a variable resistor and a variable capacitor, respectively, and may be modified when needed. For example, VDD>$V_{BIAS}$>GND. The CTLE module 120 may perform the continuous time linear equalization to perform compensation on high frequency attenuation of the set of differential signals. In addition, the slicer 130 may comprise the multiple transistors shown in FIG. 6, and may generate the digital signal according to the signals INP and INN such as the set of differential signals or the derivative signals thereof. The slicer 130 may operate according to the clock signal CLK and an inverted signal thereof such as a clock signal CLKB. More particularly, when CLK=1 and CLKB=0, the slicer 130 may determine a direction of an input signal (e.g. a difference between the signals INP and INN such as a signal (INP−INN)), to output a corresponding logic value to the offset calibration logic circuit 140 through the digital signal; when CLK=0 and CLKB=1, the output of the slicer 130 is kept unchanged. The digital signal may carry the logic value 1 or 0, and the logic value 1 or 0 may indicate whether a voltage of a signal OUTP is greater than a voltage of a signal OUTN. When an analog signal such as a signal (INP−INN) is greater than 0, the slicer 130 may output the logic value 1 (e.g. OUTP>OUTN). When the analog signal such as the signal (INP−INN) is less than 0, the slicer 130 may output the logic value 0 (e.g. OUTP<OUTN).

Based on the offset calibration architecture shown in FIG. 4, the BLWC circuit 112 may perform the offset calibration in a foreground manner. When performing calibration, the apparatus may temporarily connect the set of input terminals {RXIP, RXIN} to an input common mode voltage such as the common mode voltage Vcm$_{TX}$, and may convert an offset on the set of secondary terminals {RXOP, RXON} into a digital signal which marks (or indicates) a sign (e.g. positive or negative) of the offset through the CTLE module 120 and the slicer 130. The offset calibration logic circuit 140 may generate a calibration result such as an offset code for being fed back to the BLWC circuit 112, where the offset calibration signal offset$_{CALP}$ and offset$_{CALN}$ may carry the calibration result such as the offset code.

According to some embodiments, the BLWC circuit 112 may have at least two operating modes. When the logic value carried by the mode signal MODE is 1 (e.g. MODE=1), the common mode voltage Vcm$_{RX}$ may be an input signal of the BLWC circuit 112, and may be arranged to provide common mode feedback information to the BLWC circuit 112. The BLWC circuit 112 may provide the common mode voltage Vcm$_{RX}$ and a baseline wander compensation current through the set of secondary terminals {RXOP, RXON} to a main signal path such as a horizontal path shown in the lower-half portion of FIG. 1. When the logic value carried by the mode signal MODE is 0 (e.g. MODE=0), the common mode voltage Vcm$_{RX}$ may be an output signal of the BLWC circuit 112 arranged to provide the common mode voltage Vcm$_{RX}$, where the BLWC circuit 112 may provide the baseline wander compensation current through the set of secondary terminals {RXOP, RXON}.

Figure 7:
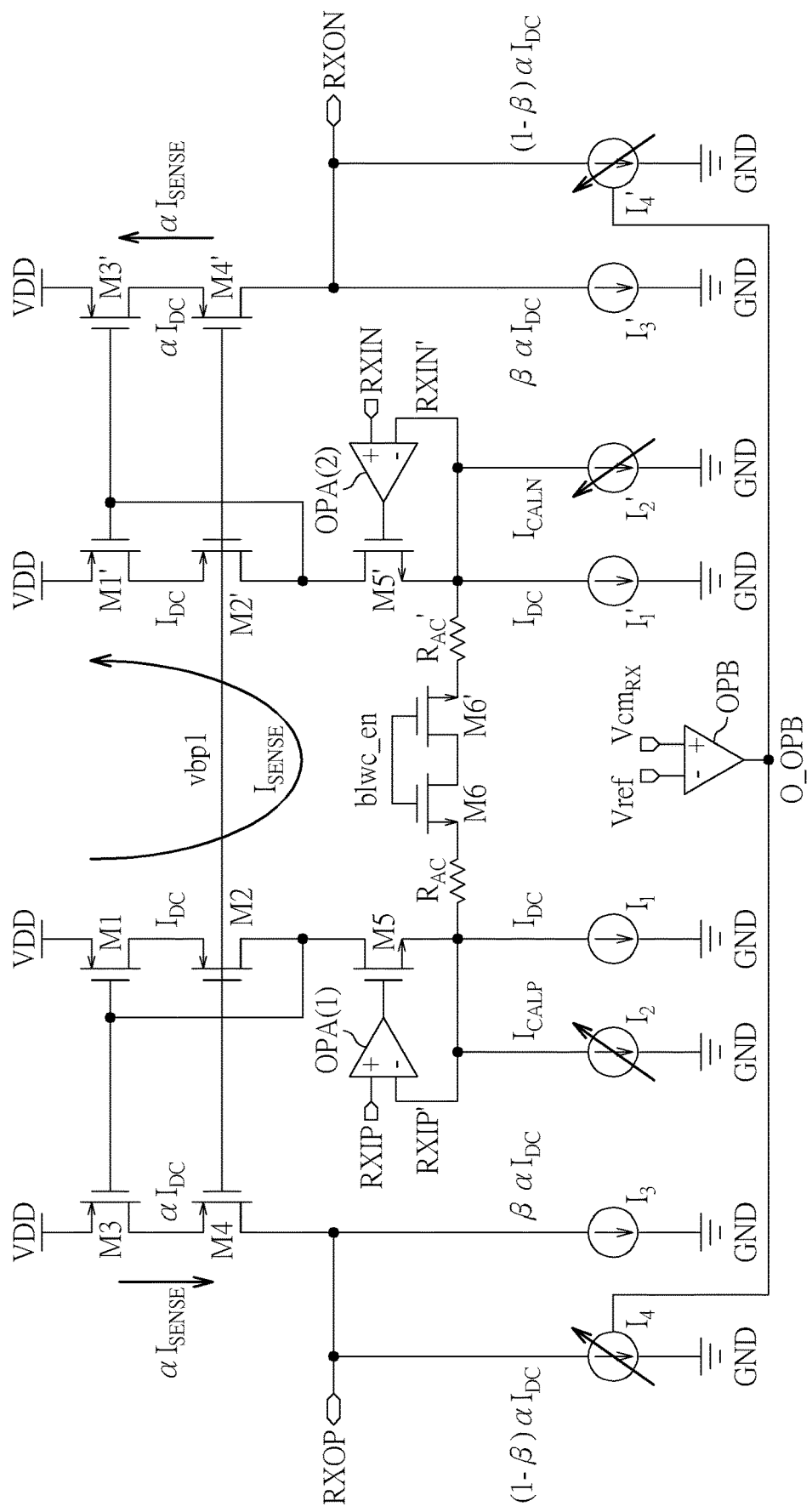
FIG. 7 illustrates a first configuration of the BLWC circuit shown in FIG. 1 arranged for a first operating mode according to an embodiment of the present invention.

FIG. 7 illustrates a first configuration of the BLWC circuit 112 shown in FIG. 1 arranged for a first operating mode according to an embodiment of the present invention. When the logic value carried by the mode signal MODE is 1 (e.g. MODE=1), the BLWC circuit 112 may be set as the first configuration, and more particularly, operate in the first operating mode when having the first configuration. The correction circuit such as the BLWC circuit 112 may comprise a set of amplifiers {OPA} such as {OPA(1), OPA(2)}, a set of resistors {$R_{AC}$, $R_{AC}'$} having the same resistance $R_{AC}$ as the resistors {$R_{AC}$} shown in FIG. 1, a set of current mirrors and another amplifier OPB, where the set of current mirrors may comprise a first current mirror such as a majority of components shown in the left-side of FIG. 7 and a second current mirror such as a majority of components shown in the right-side of FIG. 7. Respective first input terminals (e.g. positive terminals "+") of the set of amplifiers {OPA(1), OPA(2)} may be electrically connected to the set of input terminals {RXIP, RXIN}. The set of resistors {$R_{AC}$, $R_{AC}$'} may be positioned on a differential wander current sensing path (a U-shaped path where a differential wander current $I_{SENSE}$ flows) coupled between the set of input terminals {RXIP, RXIN}. Respective first terminals of the set of resistors {$R_{AC}$, $R_{AC}$'} (e.g. a left side terminal of the resistor $R_{AC}$ and a right side terminal of the resistor $R_{AC}$ in this set of resistors) may be electrically connected to respective second input terminals (e.g. negative terminals "−") of the set of amplifiers {OPA(1), OPA(2)}. The set of current mirrors may be coupled to the set of resistors {$R_{AC}$, $R_{AC}$'}, respectively, and may be electrically connected to the set of secondary terminals {RXOP, RXON}, respectively, where the set of current mirrors may generate at least one corresponding baseline wander compensation current on at least one secondary terminals of the set of secondary terminals {RXOP, RXON} according to at least one differential wander current (such as $I_{SENSE}$) on the differential wander current sensing path in order to perform the BLWC, but the present invention is not limited thereto. For example, the direction of the differential wander current $I_{SENSE}$ flowing through the U-shaped path may be reversed, and respective directions of the currents ($\alpha I_{SENSE}$) shown in the upper left corner and upper right corner of FIG. 7 may be correspondingly altered as reversed directions thereof.

According to this embodiment, the set of amplifiers {OPA(1), OPA(2)} and the set of resistors {$R_{AC}$, $R_{AC}$'} may form a differential wander current sensor, for sensing the at least one differential wander current on the differential wander current sensing path. The set of amplifiers {OPA(1), OPA(2)} may be a set of operational amplifiers. Based on characteristics of a negative feedback loop formed by connecting the output of the set of amplifiers {OPA(1), OPA(2)} back to the input thereof through a source follower, the differential wander current sensor may obtain a voltage difference between the set of input signals by copying respective voltage levels of the set of input signals for sensing the at least one differential wander current on the differential wander current sensing path. In addition, the set of resistors {$R_{AC}$, $R_{AC}$'} may be coupled between the set of current mirrors, and respective portions of transistors (e.g. $M_1$, $M_1$', $M_2$, $M_2$', etc.) of the set of current mirrors may also be positioned on the differential wander current sensing path, to allow the set of current mirrors to obtain the at least one differential wander current such as $I_{SENSE}$. According to the differential wander current $I_{SENSE}$, the first current mirror and the second current mirror may respectively generate a first baseline wander compensation current and a second baseline wander compensation current of the at least one corresponding baseline wander compensation current (such as the currents $\alpha I_{SENSE}$ respectively shown in the upper left corner and the upper right corner of FIG. 7), for performing the BLWC. Furthermore, a transistor $M_5$ embedded in the first current mirror and a transistor $M_5$' embedded in the second current mirror may be positioned on the differential wander current sensing path. An output terminal of the amplifier OPA(1) may be electrically connected to a control terminal (e.g. a gate terminal) of the transistor $M_5$ embedded in the first current mirror, and an output terminal of the amplifier OPA(2) may be electrically connected to a control terminal (e.g. a gate terminal) of the transistor $M_5$' embedded in the second current mirror.

As shown in FIG. 7, a first group of transistors {$M_1$, $M_2$} and a second group of transistors {$M_3$, $M_4$} within the first current mirror are positioned on a first current path (e.g. a path from the transistors {$M_1$, $M_2$} to current sources $I_1$ and $I_2$) and a second current path (e.g. a path from the transistors {$M_3$, $M_4$} to current sources $I_3$ and $I_4$) within the first current mirror, respectively, and a first group of transistors {$M_1$', $M_2$'} and a second group of transistors {$M_3$', $M_4$'} within the second current mirror are positioned on a first current path (e.g. a path from the transistors {$M_1$', $M_2$'} to current sources $I_1$' and $I_2$') and a second current path (e.g. a path from the transistors {$M_3$', $M_4$'} to current sources $I_3$' and $I_4$') within the second current mirror, respectively, where the respective first current paths of the first current mirror and the second current mirror overlap the differential wander current sensing path such as the aforementioned U-shaped path. In addition, a terminal (e.g. a drain terminal) of a transistor $M_4$ of the second group of transistors {$M_3$, $M_4$} within the first current mirror is electrically connected to a secondary terminal RXOP of the set of secondary terminals {RXOP, RXON}, and a terminal (e.g. a drain terminal) of a transistor $M_4$' of the second group of transistors {$M_3$', $M_4$'} within the second current mirror is electrically connected to another secondary terminal RXON of the set of secondary terminals {RXOP, RXON}.

In particular, the first current mirror may comprise at least one first current source and at least one second current source respectively positioned on the first current path and the second current path within the first current mirror (e.g. multiple first current sources respectively positioned on multiple sub-current paths of this first current path, such as the current sources $I_1$ and $I_2$, and multiple second current sources respectively positioned on multiple sub-current paths of this second current path, such as the current sources $I_3$ and $I_4$), and the second current mirror may comprise at least one first current source and at least one second current source respectively positioned on the first current path and the second current path within the second current mirror (e.g. multiple first current sources respectively positioned on multiple sub-current paths of this first current path, such as the current sources $I_1$' and $I_2$', and multiple second current sources respectively positioned on multiple sub-current paths of this second current path, such as the current sources $I_3$' and $I_4$'), wherein the set of resistors {$R_{AC}$, $R_{AC}$'} may be coupled between a node (e.g. a node above the current source $I_1$) among the first group of transistors {$M_1$, $M_2$} within the first current mirror and the at least one first current source therein (such as the current sources $I_1$ and $I_2$), and a node (e.g. a node above the current source $I_1$') among the first group of transistors {$M_1$', $M_2$'} within the second current mirror and the at least one first current source therein (such as the current sources $I_1$' and $I_2$'), but the present invention is not limited thereto. In some embodiments, the architecture shown in FIG. 7 may vary.

In addition, a current source $I_1$ (e.g. a fixed current source) and another current source $I_2$ (e.g. a controlled current source) of the multiple first current sources within the first current mirror may be arranged to generate a first static operating bias current and a first offset calibration current (such as currents $I_{DC}$ and $I_{CALP}$ respectively flowing through the current sources $I_1$ and $I_2$), and, a current source $I_1$' (e.g. a fixed current source) and another current source $I_2$' (e.g. a controlled current source) of the multiple first current sources within the second current mirror may be arranged to generate a second static operating bias current and a second offset calibration current (such as currents $I_{DC}$ and $I_{CALN}$ respectively flowing through the current sources $I_1$' and $I_2$'), respectively. A current source $I_3$ (e.g. a fixed current source) and another current source $I_4$ (e.g. a controlled current source) of the multiple second current sources within the first current mirror may be arranged to generate another first static operating bias current and a first common mode voltage stabilization control current (such as currents ($\beta\alpha I_{DC}$) and ((1-$\beta$)$\alpha I_{DC}$) respectively flowing through the current sources $I_3$ and $I_4$), respectively, and a current source $I_3$' (e.g. a fixed current source) and another current source $I_4$' (e.g. a controlled current source) of the multiple second current sources within the second current mirror may be arranged to generate another second static operating bias current and a second common mode voltage stabilization control current (such as currents ($\beta\alpha I_{DC}$) and ((1-$\beta$)$\alpha I_{DC}$) respectively flowing through the current sources $I_3$' and $I_4$'), respectively.

Based on the architecture shown in FIG. 7, the parameter $\alpha$ may be arranged to control a ratio of the current $\alpha I_{SENSE}$ relative to the differential wander current $I_{SENSE}$ and a ratio of the current ($\alpha I_{DC}$) relative to the current $I_{DC}$, and the parameter $\beta$ may be arranged to control a ratio of the current ($\beta\alpha I_{DC}$) relative to the current ($\alpha I_{DC}$) and a ratio of the current ((1-$\beta$)$\alpha I_{DC}$) relative to the current ($\alpha I_{DC}$). For example, the currents $I_{CALP}$ and $I_{CALN}$ may be regarded as offset compensation currents, the currents $I_3$ and $I_3$' may provide a portion of static operating bias currents, and the currents $I_4$ and $I_4$' may be arranged to stabilize the common mode voltage $Vcm_{RX}$. The amplifier OPA(1), the transistor $M_5$ embedded in the first current mirror and the current source $I_1$ within the first current mirror may form a source follower embedded in the first current mirror, and the amplifier OPA(2), the transistor $M_5$' embedded in the second current mirror and the current source $I_1$' within the second current mirror may form a source follower embedded in the second current mirror. Coupling an output of a source follower to a terminal (e.g. a negative terminal "−") of an amplifier OPA (e.g. the amplifiers OPA(1) and OPA(2)) of this source follower forms a negative feedback loop, which makes voltages on the terminals {RXIP', RXIN'} be equal to voltages of the set of input signals on the set of input terminals {RXIP, RXIN}, respectively. Under a condition where the set of input terminals {RXIP, RXIN} have the set of input differential signals thereon, for example, when the voltage on the input terminal RXIP is the high voltage level and the voltage on the input terminal RXIN is the low voltage level, differential voltages on the terminals {RXIP', RXIN'} may generate the differential wander current $I_{SENSE}$ shown in FIG. 7 on the set of resistors {$R_{AC}$, $R_{AC}$}, and the set of current mirrors may generate baseline wander compensation current such as the currents ($\alpha I_{SENSE}$) respectively shown in the upper left corner and the upper right corner of FIG. 7 according to the differential wander current $I_{SENSE}$, for being compensated to the set of secondary terminals {RXOP, RXON}. In another example, when the voltage on the input terminal RXIP is the low voltage level and the voltage on the input terminal RXIN is the high voltage level, the differential voltages on the terminals {RXIP', RXIN'} may generate a reversed direction differential wander current $-I_{SENSE}$ (e.g. a reversed direction current of the differential wander current $I_{SENSE}$ shown in FIG. 7) on the set of resistors {$R_{AC}$, $R_{AC}$}, and the set of current mirrors may generate baseline wander compensation currents such as reversed direction currents $-(\alpha I_{SENSE})$ (e.g. respective reversed direction currents of the currents ($\alpha I_{SENSE}$) respectively shown on the upper left corner and the upper right corner of FIG. 7) according to the reversed direction differential wander current $-I_{SENSE}$, for being compensated to the set of secondary terminals {RXOP, RXON}.

The correction circuit such as the BLWC circuit 112 may comprise at least one switch such as transistors $M_6$ and $M_6$', positioned on the differential wander current sensing path, and coupled to the set of resistors {$R_{AC}$, $R_{AC}$}. The at least one switch such as the transistors $M_6$ and $M_6$' may control whether the differential wander current sensing path is conductive or not according to the BLWC enable signal blwc_en, for allowing the detection module (e.g. the squelch detector 110S and the delay circuit 110D) to selectively enable or disable the BLWC circuit 112 (more particularly, BLWC and calibration functions thereof) through the BLWC enable signal blwc_en.

In this embodiment, a first input terminal and a second input terminal (e.g. a positive terminal "+" and a negative terminal "−") of the amplifier OPB are electrically connected to a common mode voltage $Vcm_{RX}$ of the set of differential signals and the reference voltage Vref, respectively. As shown in the bottom left corner of FIG. 7, the aforementioned another current source $I_4$ of the multiple second current sources $I_3$ and $I_4$ within the first current mirror may be a controlled current source such as a voltage controlled current source, may be electrically connected to an output terminal O_OPB of the amplifier OPB and may operate under control of the amplifier OPB to stabilize the common mode voltage $Vcm_{RX}$. As shown in the bottom right corner of FIG. 7, the aforementioned another current source $I_4$' of the multiple second current sources $I_3$' and $I_4$' within the second current mirror may be a controlled current source such as a voltage controlled current source, may be electrically connected to the output terminal O_OPB of the amplifier OPB and may operate under control of the amplifier OPB to stabilize the common mode voltage $Vcm_{RX}$. For example, under control of the BLWC circuit 112, the set of differential signals on the set of secondary terminals {RXOP, RXON} may utilize the set of resistors {$R_{AC}$} shown in the lower half portion of FIG. 1 to generate the common mode voltage $Vcm_{RX}$ to be an input of the positive terminal "+" of the amplifier OPB, and the reference voltage Vref may be an input of the negative terminal "−" of the amplifier OPB, where an output signal on the output terminal O_OPB of the amplifier OPB may be the voltage controlled current sources such as $I_4$ and $I_4$', and such a signal path may form a common mode feedback loop.

Figure 8:
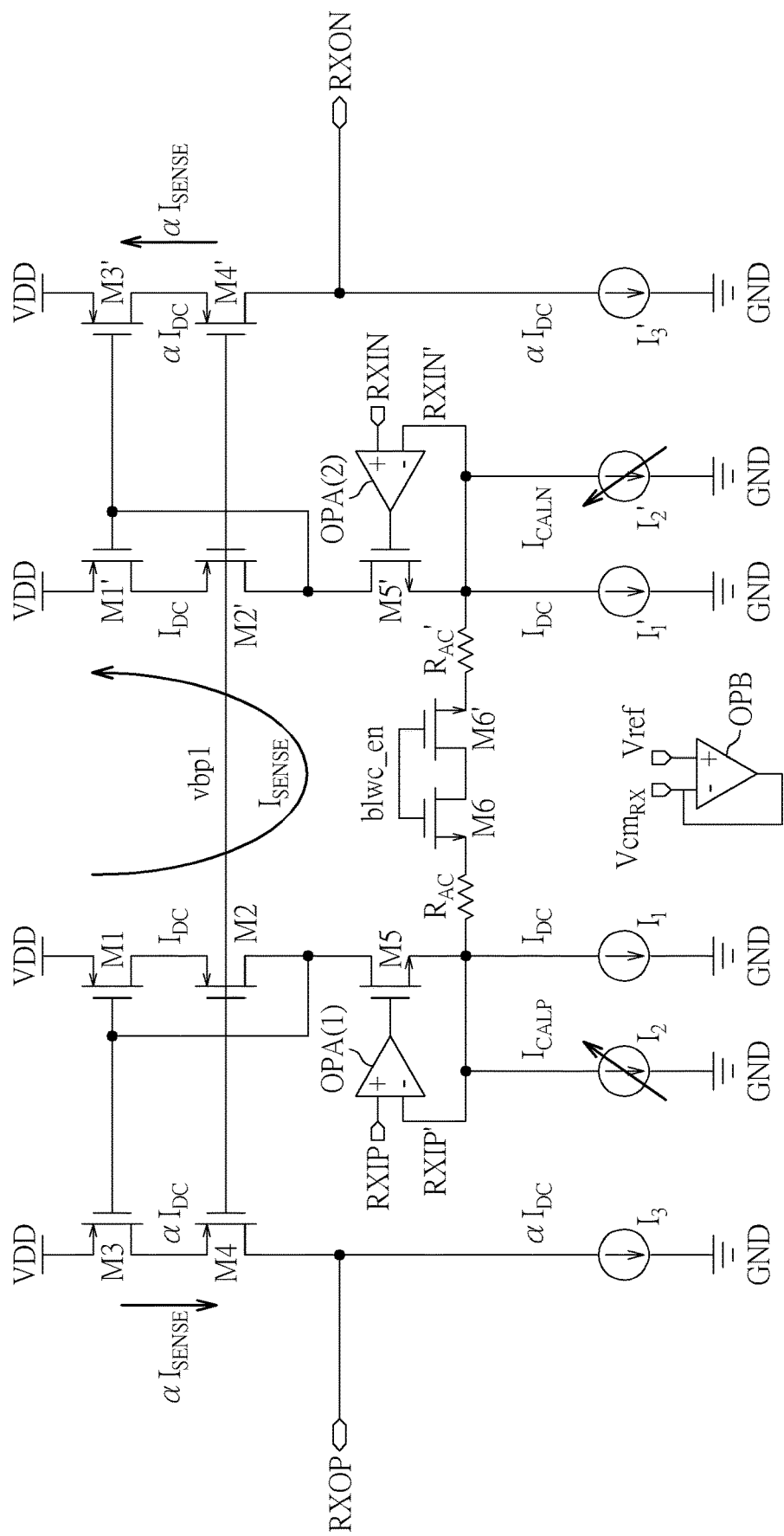
FIG. 8 illustrates a second configuration of the BLWC circuit shown in FIG. 1 arranged for a second operating mode according to an embodiment of the present invention.

FIG. 8 illustrates a second configuration of the BLWC circuit 112 shown in FIG. 1 arranged for a second operating mode according to an embodiment of the present invention. When the logic value carried by the mode signal MODE is 0, (e.g. MODE=0), the BLWC circuit 112 may be set as the second configuration, and more particularly, operate in the second operating mode when having the second configuration. In comparison with the architecture shown in FIG. 7, the first input terminal (e.g. the positive terminal "+"), the second input terminal (e.g. the negative terminal "−") and the output terminal O_OPB of the amplifier OPB may be electrically connected to the reference voltage Vref, the common mode voltage $Vcm_{RX}$ of the set of differential signals and the second input terminal (e.g. the negative terminal "−") of the amplifier OPB, respectively, and the amplifier OPB may be configured as a unit gain buffer, to provide the set of secondary terminals {RXOP, RXON} with the common mode voltage $Vcm_{RX}$ through a portion of filters (e.g. the resistors {$R_{AC}$} within the filtering and common mode control circuit 110H) of the multiple filters. When the logic value carried by the mode signal MODE is 0 (e.g. MODE=0), the principle of the BLWC circuit 112 generating the baseline wander compensation current may be the same as that of the embodiment shown in FIG. 7, and the main difference between the embodiments respectively shown in FIG. 7 and FIG. 8 is the manner of generating the common mode voltage $Vcm_{RX}$.

According to some embodiments, the current source $I_4$ and $I_4'$ may be combined with (e.g. integrated into) the current sources $I_3$ and $I_3'$, respectively, but the present invention is not limited thereto. In some embodiments, the current sources $I_4$ and $I_4'$ may be directly removed, rather than being respectively combined with (e.g. integrated into) the current sources $I_3$ and $I_3'$.

According to some embodiments, the aforementioned another first static operating bias current may comprise a total current (e.g. the current ($\alpha I_{DC}$)) of the current ($\beta \alpha I_{DC}$) flowing through the current source $I_3$ and the current (($1-\beta)\alpha I_{DC}$) flowing through the current source $I_4$, and the aforementioned another second static operating bias current may comprise a total current (e.g. the current ($\alpha I_{DC}$)) of the current ($\beta \alpha I_{DC}$) flowing through the current source $I_3'$ and the current (($1-\beta)\alpha I_{DC}$) flowing through the current source $I_4'$.

Figure 9:
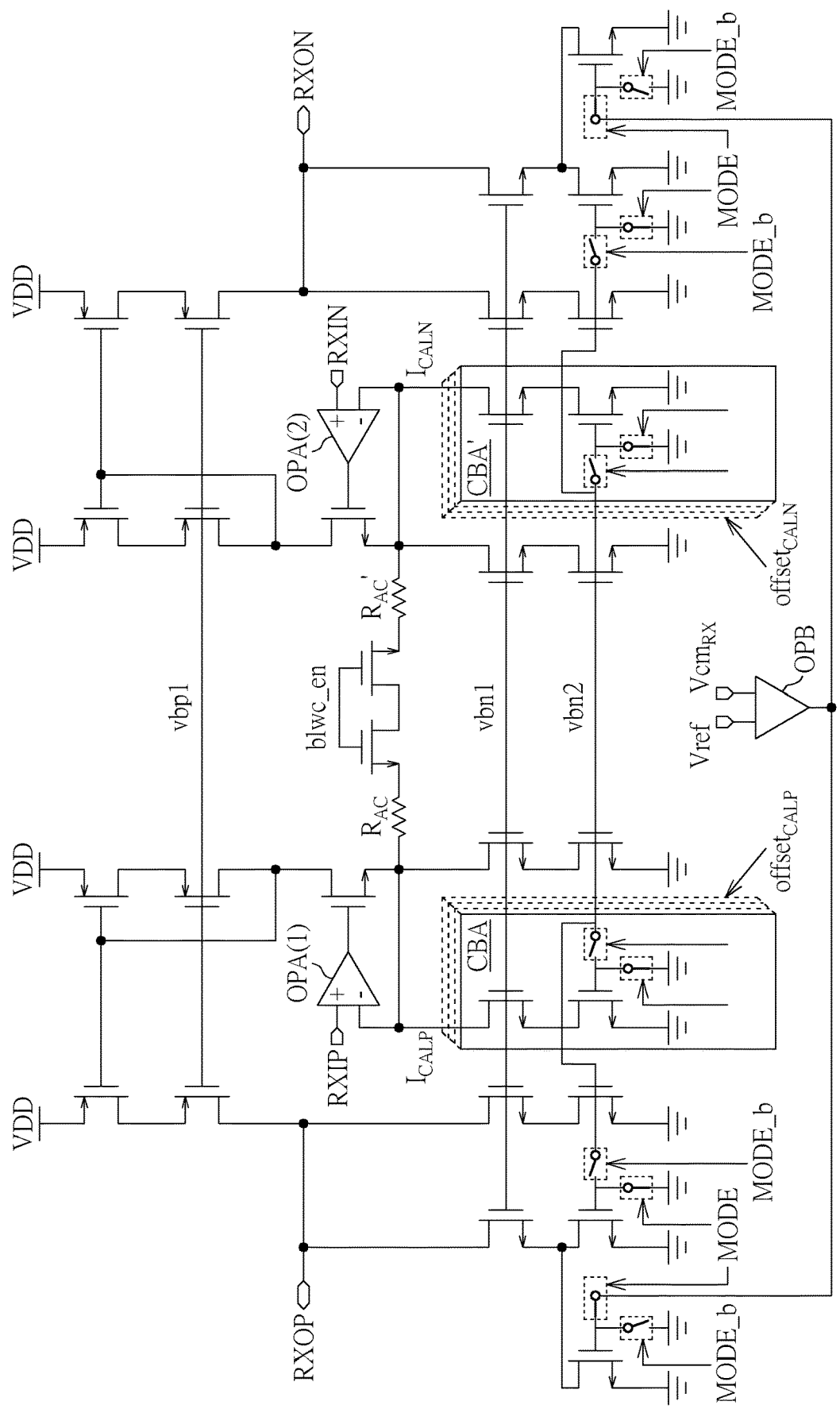
FIG. 9 illustrates a circuit architecture of the BLWC circuit shown in FIG. 1 according to an embodiment of the present invention.

FIG. 9 illustrates a circuit architecture of the BLWC circuit 112 shown in FIG. 1 according to an embodiment of the present invention, where this circuit architecture may operate based on bias voltages vbp1, vbn1 and vbn2, and VDD>vbp1>vbn1>vbn2>GND, but the present invention is not limited thereto. Based on the selection of the mode signal MODE, the BLWC circuit 112 may perform configuration switching according to the mode signal MODE and an inverted signal thereof such as a mode signal MODE b (e.g. through multiple switches therein such as those shown in the dashed box), to operate in the selected mode. When the logic value carried by the mode signal MODE is 1 and a logic value carried by the mode signal MODE b is 0 (e.g. MODE=1 and MODE b=0), the BLWC circuit 112 is set as the first configuration shown in FIG. 7 to operate in the first operating mode. When the logic value carried by the mode signal MODE is 0 and the logic value carried by the mode signal MODE b is 1 (e.g. MODE=0 and MODE b=1), the BLWC circuit 112 is set as the second configuration shown in FIG. 8 to operate in the second operating mode. In addition, the offset calibration logic circuit 140 shown in FIG. 4 may control a controlled current source $I_2$ (e.g. a current bank CBA shown in FIG. 9) of the at least one first current source within the first current mirror and a controlled current source $I_2'$ (e.g. a current bank CBA' shown in FIG. 9) of the at least one first current source within the second current mirror through the offset calibration signal offset$_{CALP}$ and offset$_{CALN}$, to control the BLWC circuit 112 to perform the offset calibration.

According to some embodiments, some currents in FIG. 7 and FIG. 8 such as the voltage controlled current sources (e.g. $I_1$ to $I_4$, $I_1'$ to $I_4'$) may be implemented by a cascade structure, to reduce impact regarding the common mode voltage $Vcm_{RX}$ due to current mismatch and power/ground noise. The current bank CBA and CBA' may be arranged for offset calibration. Because of the differential characteristic of the BLWC circuit 112, when the secondary terminal RXOP has a positive offset voltage thereon, the apparatus may perform calibration by increasing the current of the current bank CBA'; and when the secondary terminal RXOP has a negative offset voltage thereon, the apparatus may perform calibration by increasing the current of the current bank CBA. In addition, when the secondary terminal RXON has a positive offset voltage thereon, the apparatus may perform calibration by increasing the current of the current bank CBA; and when the secondary terminal RXON has a negative offset voltage thereon, the apparatus may perform calibration by increasing the current of the current bank CBA'. Furthermore, the offset calibration logic circuit 140 may count the numbers of received logic values 1 and 0 during a predetermined time period. If the number of the logic values 1 is greater than that of the logic values 0, it means a positive offset exists (e.g. the secondary terminal RXOP has the positive offset voltage thereon), and the apparatus may increase the current $I_{CALN}$ to cancel the positive offset by increasing the offset calibration signal offset$_{CALN}$. If the number of the logic values 0 is greater than that of the logic values 1, it means a negative offset exists (e.g. the secondary terminal RXOP has the negative offset voltage thereon), and the apparatus may increase the current $I_{CALP}$ to cancel the negative offset by increasing the offset calibration signal offset$_{CALP}$.

According to some embodiments, the operations related to the current banks CBA and CBA' may vary. For example, increasing the current of the current bank CBA' may be replaced with reducing the current of the current bank CBA, or be replaced with increasing the current of the current bank CBA' and reducing the current of the current bank CBA. In another example, increasing the current of the current bank CBA may be replaced with reducing the current of the current bank CBA', or be replaced with increasing the current of the current bank CBA and reducing the current of the current bank CBA'.

According to some embodiments, the number of the multiple modes may vary, where when this number is reduced to one, the mode signals MODE and MODE b and associated switches may be omitted. For example, the circuit architecture shown in FIG. 9 may be simplified as the first configuration shown in FIG. 7. In another example, the circuit architecture shown in FIG. 9 may be simplified as the second configuration shown in FIG. 8.

Figure 10:
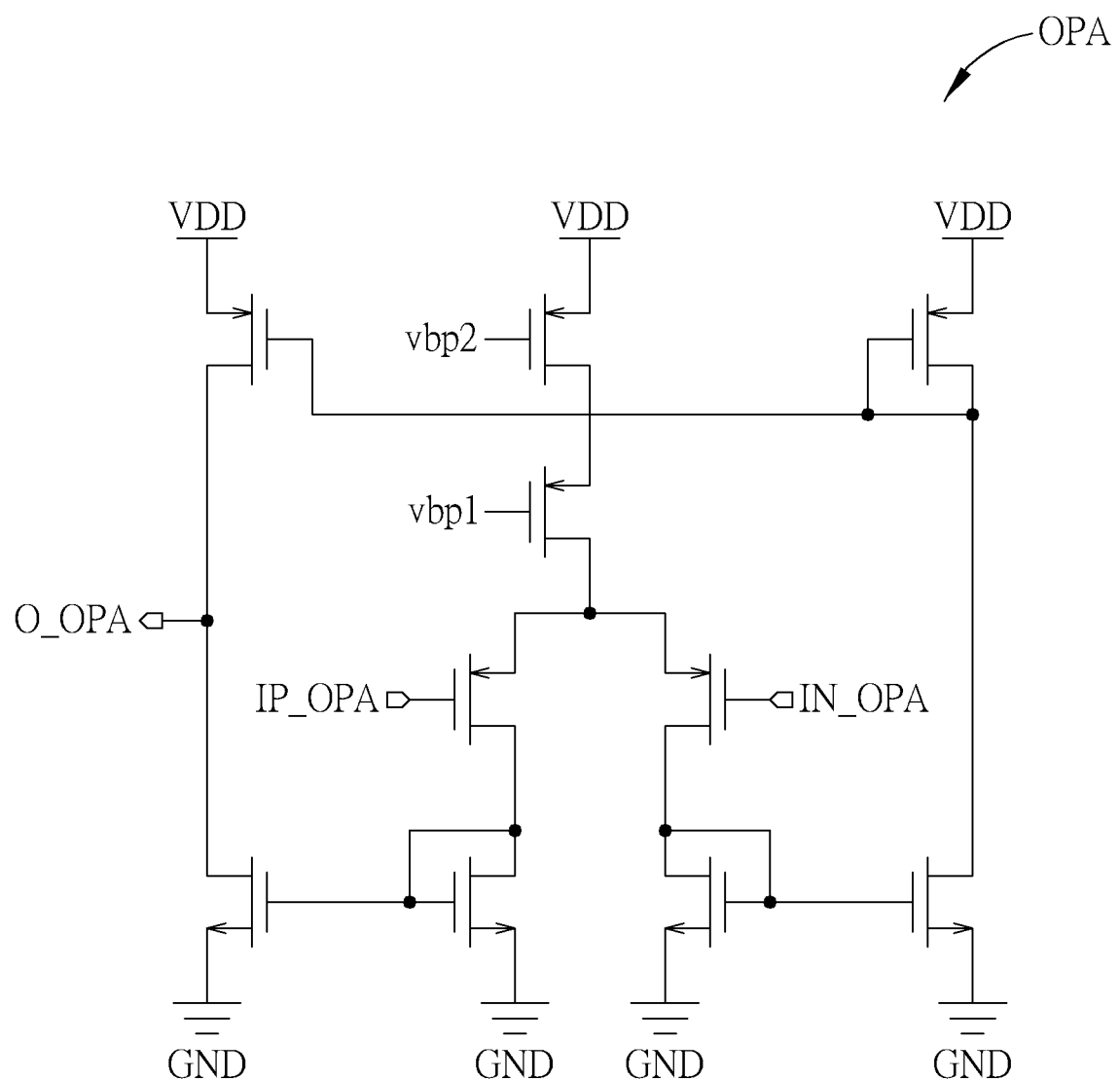
FIG. 10 illustrates an example of any amplifier of a set of amplifiers shown in FIG. 9.

FIG. 10 illustrates an example of any amplifier OPA (e.g. each amplifier) of the set of amplifiers {OPA(1), OPA(2)} shown in FIG. 9, where the amplifier OPA may operate based on bias voltages vbp1 and vbp2, and VDD>vbp2>vbp1>GND, but the present invention is not limited thereto. Terminals IP_OPA, IN_OPA and O_OPA may represent the first input terminal (e.g. the positive terminal "+"), the second input terminal (e.g. the negative terminal "−") and the output terminal of the amplifier OPA (such as any of the amplifiers {OPA(1), OPA(2)}), respectively. According to this embodiment, the amplifier OPA may be regarded as a differential to single-ended differential operational amplifier. The amplifier OPA may amplify a differential voltage between respective input voltages of the terminals IP_OPA and IN_OPA, to convert this differential voltage into a single-ended output on the terminal O_OPA.

Figure 11:
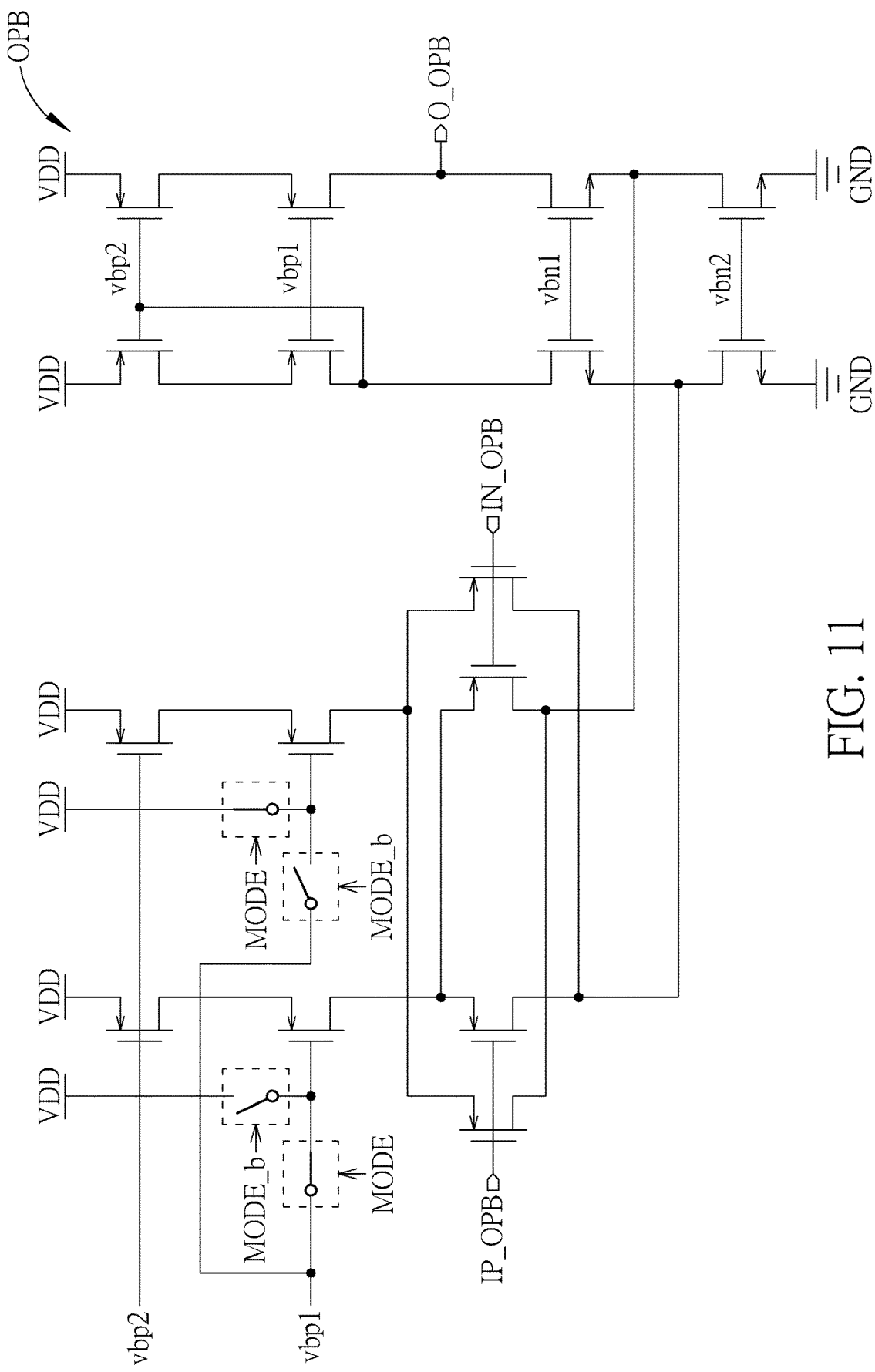
FIG. 11 illustrates an example of another amplifier shown in FIG. 9.

FIG. 11 illustrates an example of the amplifier OPB shown in FIG. 9, where the amplifier OPB may operate based on the bias voltages vbp1, vbp2, vbn1 and vbn2, and VDD>vbp2>vbp1>vbn1>vbn2>GND, but the present invention is not limited thereto. Terminals IP_OPB and IN_OPB may represent the first input terminal (e.g. the positive terminal "+") and the second input terminal (e.g. the negative terminal "−") of the amplifier OPB, respectively. According to this embodiment, the amplifier may adopt the cascade structure, and may be designed to have an input polarity switching function to correctly operate according to respective input voltages IP_OPB and IN_OPB of the terminals IP_OPB and IN_OPB. When the logic value carried by the mode signal MODE is 1 (e.g. MODE=1 and MODE b=0), if IP_OPB>IN_OPB, an output on the output terminal O_OPB is positive; and if IP_OPB<IN_OPB, the output on the output terminal O_OPB is negative. When the logic value carried by the mode signal MODE is 0 (e.g. MODE=0 and MODE b=1), if IP_OPB>IN_OPB, the output on the output terminal o_OPB is negative; and if IP_OPB<IN_OPB, the output on the output terminal O_OPB is positive.

According to the above embodiments, the apparatus of the present invention can properly eliminate baseline wander of any AC coupling circuit, and can further provide the AC coupling circuit with a stable common mode voltage. The apparatus of the present invention also has good circuit characteristics, which include, but are not limited to:

(1) The apparatus of the present invention can perform current compensation based on differential wander current sensing, and can generate a corresponding compensation current by detecting a voltage difference between differential signals on the set of input terminals {RXIP, RXIN} in order to compensate the baseline wander, where adopting the current source with the cascade structure can provide excellent power supply rejection ratio (PSRR) and suppress common mode noise introduced by power voltages.

(2) The apparatus of the present invention adopts analog architecture to minimize the compensation time delay. The apparatus can improve positive/negative (P/N) distortion of the input differential signals through a fully-differential structure of the BLWC circuit 112 and can compensate and calibrate P/N offset introduced by one or more factors such as component mismatch, bad input differential signals, etc. through the offset calibration logic circuit 140.

(3) The apparatus of the present invention can prevent providing any feedback path from the set of secondary terminals RXOP and RXON to the set of input terminals {RXIP, RXIN}, and can therefore provide good isolation between common mode voltages $Vcm_{TX}$ and $Vcm_{RX}$ in the front/back of AC coupling capacitors (e.g. the capacitors $\{C_{AC}\}$ shown in FIG. 1), where setting the common mode voltage $Vcm_{RX}$ of the set of secondary terminals {RXOP, RXON} will not impact the common mode voltage $Vcm_{TX}$ of the set of input terminals {RXIP, RXIN} at all.

(4) The apparatus of the present invention can temporarily disable the BLWC circuit 112 during an initialization phase of stabilizing the common mode voltage of the differential signals on the set of secondary terminals {RXOP, RXON} according to output information (e.g. the squelch detector output signal carrying the detection result) of the squelch detector 110S, to minimize the common mode voltage stabilization time, and is therefore suitable for applications of fast switched input signals, where at the same time of performing baseline wander compensation, the apparatus can provide the common mode voltage through a common mode feedback (e.g. through a feedback loop such as the second amplifier OPB, the current sources $I_4$ and $I_4'$ and the set of secondary terminals {RXOP, RXON} shown in FIG. 7) or a unit gain buffer (e.g. the second amplifier OPB and connections thereof shown in FIG. 8).

The apparatus of the present invention is applicable to various high speed interface products such as various types of SerDes electronic products, where the high speed interface products may conform to at least one communications specification such as a Peripheral Component Interconnect Express (PCIe) specification, a Universal Serial Bus (USB) specification, and more particularly, may conform to the latest or later versions thereof such as PCIe G4 or USB 3.1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing baseline wander correction (BLWC) with the aid of differential wander current sensing, comprising:
    multiple filters, positioned in a front-end circuit of a receiver and coupled to a set of input terminals of the receiver, arranged to filter a set of input signals on the set of input terminals to generate a set of differential signals on a set of secondary terminals for further usage by the receiver; and
    a correction circuit, positioned in the front-end circuit and electrically connected to the set of input terminals and the set of secondary terminals, respectively, arranged to perform the BLWC on the set of differential signals according to the set of input signals, wherein a set of amplifiers and a set of resistors within the correction circuit form a differential wander current sensor, to sense at least one differential wander current on a differential wander current sensing path which flows in a U-shaped path between the set of input terminals, and a set of current mirrors within the correction circuit generates at least one corresponding baseline wander compensation current according to the at least one differential wander current on the differential wander current sensing path, to perform the BLWC;
    wherein a first group of transistors within a first current mirror of the set of current mirrors and at least one first current source are positioned on a first current path within the first current mirror, a second group of transistors within the first current mirror and at least one second current source are positioned on a second current path within the first current mirror; a first group of transistors within a second current mirror of the set of current mirrors and at least one first current source are positioned on a first current path within the second current mirror, a second group of transistors within the second current mirror and at least one second current source are positioned on a second current path within the second current mirror; and the first current paths of the first current mirror and the second current mirror overlap the differential wander current sensing path, respectively;
    wherein the at least one second current source within the first current mirror comprises multiple second current sources respectively positioned on multiple sub-current paths of the second current path within the first current mirror, wherein a current source and another current source of the multiple second current sources within the first current mirror are arranged to generate a first static operating bias current and a first common mode voltage stabilization control current, respectively; and the at least one second current source within the second current mirror comprises multiple second current sources respectively positioned on multiple sub-current paths of the second current path within the second current mirror, wherein a current source and another current source of the multiple second current sources within the second current mirror are arranged to generate a second static operating bias current and a second common mode voltage stabilization control current.

2. The apparatus of claim 1, wherein the correction circuit comprises:

the set of amplifiers, wherein respective first input terminals of the set of amplifiers are electrically connected to the set of input terminals, respectively;

the set of resistors, positioned on the differential wander current sensing path coupled between the set of input terminals, wherein respective first terminals of the set of resistors are electrically connected to respective second input terminals of the set of amplifiers, respectively; and the set of current mirrors, respectively coupled to the set of resistors and respectively electrically connected to the set of secondary terminals, arranged to generate the at least one corresponding baseline wander compensation current on at least one secondary terminal of the set of secondary terminals according to the at least one differential wander current on the differential wander current sensing path, to perform the BLWC.

3. The apparatus of claim 1, wherein the set of resistors is coupled between the set of current mirrors, and respective partial transistors of the set of current mirrors are positioned on the differential wander current sensing path, to allow the set of current mirrors to obtain the at least one differential wander current.

4. The apparatus of claim 1, wherein a first current mirror and a second current mirror of the set of current mirrors generate a first baseline wander compensation current and a second baseline wander compensation current of the at least one corresponding baseline wander compensation current, respectively, for performing the BLWC.

5. The apparatus of claim 1, wherein a transistor embedded in the first current mirror and a transistor embedded in the second current mirror are positioned on the differential wander current sensing path; an output terminal of a first amplifier of the set of amplifiers is electrically connected to a control terminal of the transistor embedded in the first current mirror; and an output terminal of a second amplifier of the set of amplifiers is electrically connected to a control terminal of the transistor embedded in the second current mirror.

6. The apparatus of claim 5, wherein the first amplifier, the transistor embedded in the first current mirror and a current source within the first current mirror form a source follower embedded in the first current mirror; and the second amplifier, the transistor embedded in the second current mirror and a current source within the second current mirror form a source follower embedded in the second current mirror.

7. The apparatus of claim 1, wherein a terminal of a transistor of the second group of transistors within the first current mirror is electrically connected to a first secondary terminal of the set of secondary terminals; and a terminal of a transistor of the second group of transistors within the second current mirror is electrically connected to a second secondary terminal of the set of secondary terminals.

8. The apparatus of claim 1, wherein the set of resistors is coupled between a node among the first group of transistors within the first current mirror and the at least one first current source within the first current mirror, and a node among the first group of transistors within the second current mirror and the at least one first current source within the second current mirror.

9. The apparatus of claim 1, wherein the at least one first current source within the first current mirror comprises multiple first current sources respectively positioned on multiple sub-current paths of the first current path within the first current mirror, wherein a current source and another current source of the multiple first current sources within the first current mirror are arranged to generate a first static operating bias current and a first offset calibration current, respectively; and the at least one first current source within the second current mirror comprises multiple first current sources respectively positioned on multiple sub-current paths of the first current path within the second current mirror, wherein a current source and another current source of the multiple first current sources within the second current mirror are arranged to generate a second static operating bias current and a second offset calibration current.

10. The apparatus of claim 9, wherein said another current source of the multiple first current sources within the first current mirror is a controlled current source; and said another current source of the multiple first current sources within the second current mirror is a controlled current source.

11. The apparatus of claim 1, further comprising:

another amplifier, wherein a first input terminal and a second input terminal of said another amplifier are electrically connected to a common mode voltage of the set of differential signals and a reference voltage, respectively, wherein:

said another current source of the multiple second current sources within the first current mirror is a controlled current source, and is electrically connected to an output terminal of said another amplifier, wherein said another current source of the multiple second current sources within the first current mirror operates under control of said another amplifier to stabilize the common mode voltage; and said another current source of the multiple second current sources within the second current mirror is a controlled current source, and is electrically connected to the output terminal of said another amplifier, wherein said another current source of the multiple second current sources within the second current mirror operates under control of said another amplifier to stabilize the common mode voltage.

12. An apparatus for performing baseline wander correction (BLWC) with the aid of differential wander current sensing, comprising:

multiple filters, positioned in a front-end circuit of a receiver and coupled to a set of input terminals of the receiver, arranged to filter a set of input signals on the set of input terminals to generate a set of differential signals on a set of secondary terminals for further usage by the receiver;

a correction circuit, positioned in the front-end circuit and electrically connected to the set of input terminals and the set of secondary terminals, respectively, arranged to perform the BLWC on the set of differential signals according to the set of input signals, wherein a set of amplifiers and a set of resistors within the correction circuit form a differential wander current sensor, to sense at least one differential wander current on a differential wander current sensing path which flows in a U-shaped path between the set of input terminals, and a set of current mirrors within the correction circuit generates at least one corresponding baseline wander compensation current according to the at least one differential wander current on the differential wander current sensing path, to perform the BLWC; and another amplifier, wherein a first input terminal, a second input terminal and an output terminal of said another amplifier are electrically connected to a reference voltage, a common mode voltage of the set of differential signals and the second input terminal of said another amplifier, respectively, and said another amplifier is configured as a unit gain buffer (UGB) to provide the common mode voltage to the set of secondary terminals through a portion of filters of the multiple filters.

13. An apparatus for performing baseline wander correction (BLWC) with the aid of differential wander current sensing, comprising:
   multiple filters, positioned in a front-end circuit of a receiver and coupled to a set of input terminals of the receiver, arranged to filter a set of input signals on the set of input terminals to generate a set of differential signals on a set of secondary terminals for further usage by the receiver;
   a correction circuit, positioned in the front-end circuit and electrically connected to the set of input terminals and the set of secondary terminals, respectively, arranged to perform the BLWC on the set of differential signals according to the set of input signals, wherein a set of amplifiers and a set of resistors within the correction circuit form a differential wander current sensor, to sense at least one differential wander current on a differential wander current sensing path which flows in a U-shaped path between the set of input terminals, and a set of current mirrors within the correction circuit generates at least one corresponding baseline wander compensation current according to the at least one differential wander current on the differential wander current sensing path, to perform the BLWC;
   a slicer, coupled to the set of secondary terminals, arranged to generate a digital signal according to the set of differential signals or derivative signals thereof; and
   an offset calibration logic circuit, electrically connected to the slicer and the correction circuit, arranged to generate an offset calibration signal according to the digital signal, to control the correction circuit to perform offset calibration.

14. The apparatus of claim 13, wherein at least one first current source and at least one second current source within a first current mirror of the set of current mirrors are positioned on a first current path and a second current path within the first current mirror, respectively; at least one first current source and at least one second current source within a second current mirror of the set of current mirrors are positioned on a first current path and a second current path within the second current mirror, respectively; the first current paths of the first current mirror and the second current mirror overlap the differential wander current sensing path, respectively; and the offset calibration logic circuit controls a controlled current source of the at least one first current source of the first current mirror and a controlled current source of the at least one first current source of the second current mirror, to control the correction circuit to perform the offset calibration.

15. An apparatus for performing baseline wander correction (BLWC) with the aid of differential wander current sensing, comprising:
   multiple filters, positioned in a front-end circuit of a receiver and coupled to a set of input terminals of the receiver, arranged to filter a set of input signals on the set of input terminals to generate a set of differential signals on a set of secondary terminals for further usage by the receiver;
   a correction circuit, positioned in the front-end circuit and electrically connected to the set of input terminals and the set of secondary terminals, respectively, arranged to perform the BLWC on the set of differential signals according to the set of input signals, wherein a set of amplifiers and a set of resistors within the correction circuit form a differential wander current sensor, to sense at least one differential wander current on a differential wander current sensing path which flows in a U-shaped path between the set of input terminals, and a set of current mirrors within the correction circuit generates at least one corresponding baseline wander compensation current according to the at least one differential wander current on the differential wander current sensing path, to perform the BLWC; and
   a detection module, coupled to the set of secondary terminals and the correction circuit, arranged to perform detection according to the set of differential signals or derivative signals thereof to generate a BLWC enable signal, for selectively enabling or disabling the correction circuit.

16. The apparatus of claim 15, wherein the detection module comprises:
   a squelch detector, coupled to the set of secondary terminals, arranged to perform squelch detection according to the set of differential signals or derivative signals thereof to generate a squelch detector output signal; and
   a delay circuit, coupled to the squelch detector and the correction circuit, arranged to perform a delay operation according to the squelch detector output signal to generate the BLWC enable signal.

17. The apparatus of claim 15, wherein a first group of transistors and a second group of transistors within a first current mirror of the set of current mirrors are positioned on a first current path and a second current path within the first current mirror, respectively; a first group of transistors and a second group of transistors within a second current mirror of the set of current mirrors are positioned on a first current path and a second current path within the second current mirror, respectively; the first current paths of the first current mirror and the second current mirror overlap the differential wander current sensing path, respectively;
   and the correction circuit further comprises:
   at least one switch, positioned on the differential wander current sensing path and coupled to the set of resistors, arranged to control whether the differential wander current sensing path is conductive or not according to the BLWC enable signal, to allow the detection module to selectively enable or disable the correction circuit through the BLWC enable signal.

* * * * *